United States Patent [19]

Tarng

[11] 4,315,782

[45] Feb. 16, 1982

[54] METHOD OF MAKING SEMICONDUCTOR DEVICE WITH PASSIVATED RECTIFYING JUNCTIONS HAVING HYDROGENATED AMORPHOUS REGIONS

[75] Inventor: Ming L. Tarng, Mercerville, N.J.

[73] Assignee: RCA Corporation, New York, N.Y.

[21] Appl. No.: 170,813

[22] Filed: Jul. 21, 1980

[51] Int. Cl.³ .................... H01L 21/265; H01L 21/26
[52] U.S. Cl. .................................. 148/1.5; 148/187;
357/52; 357/91; 427/53.1
[58] Field of Search ................... 148/1.5, 187; 357/52, 357/91; 427/53.1

[56] References Cited

U.S. PATENT DOCUMENTS

| | | | |
|---|---|---|---|
| 4,056,642 | 11/1977 | Saxena et al. | 427/84 |
| 4,084,986 | 4/1978 | Aoki et al. | 148/1.5 |
| 4,098,921 | 7/1978 | Calviello | 357/52 |
| 4,113,514 | 9/1978 | Pankove et al. | 148/1.5 |
| 4,151,058 | 4/1979 | Kaplan et al. | 427/38 |
| 4,201,998 | 5/1980 | Cho et al. | 357/52 |
| 4,215,358 | 7/1980 | Wataze et al. | 357/52 |
| 4,216,030 | 8/1980 | Graul et al. | 357/20 |
| 4,224,083 | 9/1980 | Cresswell | 148/1.5 |
| 4,224,084 | 9/1980 | Pankove | 148/1.5 |
| 4,266,986 | 5/1981 | Benton et al. | 148/1.5 |

FOREIGN PATENT DOCUMENTS

54-147777  11/1979  Japan .................. 148/1.5

OTHER PUBLICATIONS

Peercy et al. in Laser-Solid interactions & Laser Processing, 1978, ed. Ferris et al., AIP, N.Y., 1979, 331.
Freeouf, IBM-TDB, vol. 22 (1980), 3864.
Paesler et al., Phys. Rev. Letts. 41 (1978), 1492.
Kaplan et al., Appl. Phys. Letts. 33 (1978), 440.

*Primary Examiner*—Upendra Roy
*Attorney, Agent, or Firm*—Birgit E. Morris; Donald S. Cohen; Joseph D. Lazar

[57] ABSTRACT

A device and method for forming the device formed of semiconductor material provides metallization for the circuit and passivation of a rectifying junction in but a single photolithographic etching step. The device may be formed of silicon, gallium arsenide or silicon-on-sapphire. The rectifying junctions may be formed of material of opposite conductivity types or may be of the Schottky barrier type in which metal in contact with a semiconductor material forms a rectifying junction. Metal is initially deposited at suitable temperatures over all the surface of a body of material having rectifying junctions. The metal over the junctions is removed by a photolithographic resist process leaving the rectifying junctions clear of metal. The metal or metals are then heat treated at high temperatures. The rectifying junction is passivated by amorphization and hydrogenation at relatively low temperatures to provide the device with a passivated junction of graded crystallinity. The formation of two-rectifying junction mesa-type transistor is described using only two photolithographic etching steps. A semiconductor device made by these processes are extremely stable.

12 Claims, 8 Drawing Figures

METHOD OF MAKING SEMICONDUCTOR DEVICE WITH PASSIVATED RECTIFYING JUNCTIONS HAVING HYDROGENATED AMORPHOUS REGIONS

BACKGROUND OF THE INVENTION

This invention relates to a method for forming and the structure formed thereby of a semiconductor device having rectifying junctions with passivated surfaces at the junctions.

In the art of forming semiconductor devices having rectifying junctions that require passivation in order to prevent degradation of the rectifying junction at the surface it is usual to provide passivating material such as silicon dixoide over the entire surface of the device to be treated. The silicon dixoide is then etched away as by a photoresist process to expose the portions of the device defining the active contact regions. Metal is then deposited over the entire surface covering both the passivating silicon dioxide as well as the exposed contact regions. The metal is then removed by a photoresist process from the portions of the device defining the rectifying junctions.

An improved method for passivating the rectifying junction portions comprises what may be termed "neutralizing" the so-called "dangling bonds" in a semiconductor device by reducing the number of recombination and generation centers at the surface of the device. The procedure and device which achieve such a passivating surface is disclosed in U.S. Application Ser. No. 30,704, filed on Apr. 16, 1979 by J. I. Pankove, entitled "METHOD AND STRUCTURE FOR PASSIVATING A SEMICONDUCTOR DEVICE", now U.S. Pat. No. 4,224,084, issued Sept. 23, 1980.

In general, passivants are added to semiconductor devices to protect the surface from ambient conditions and to otherwise affect the surface material in a desired way. The most commonly used passivant is silicon dioxide which can be either thermally grown on silicon at high temperature (900° C. to 1200° C.) or it can be chemical vapor deposited (CVD) at lower temperatures, typically 400° C. Other passivants are silicon nitride, various silicate glasses, or more recently, SIPOS (semi-insulating polycrystalline silicon) and plasma deposited hydrogenated amorphous silicon. In a conventional method using, for example, silicon dioxide as the passivant, the sequence of etching steps on, initially, the layers of silicon dioxide and, subsequently, on the layer of metal is both costly and time consuming when the etching is done using photolithographic resist techniques. As for the passivation process described by Pankove, supra, which although more high temperature resistant than the plasma deposited hydrogenated amorphous silicon, the problem of degrading the passivant surfaces at the high metal treatment temperatures is still of concern in the art.

SUMMARY OF THE INVENTION

According to the present invention, a semiconductor device having one or more rectifying junctions is initially metallized and defined by only one photolithographic etching step followed by surface passivation of the rectifying junction by amorphization and hydrogenation passivation steps. For mesa-type transistor devices accordingly having two rectifying junctions, only two photolithographic etching steps are required, one to define and etch the mesa moat and the other to define the subsequently deposited metallized layer.

DETAILED DESCRIPTION OF A PREFERRED EMBODIMENT

Figure 1:
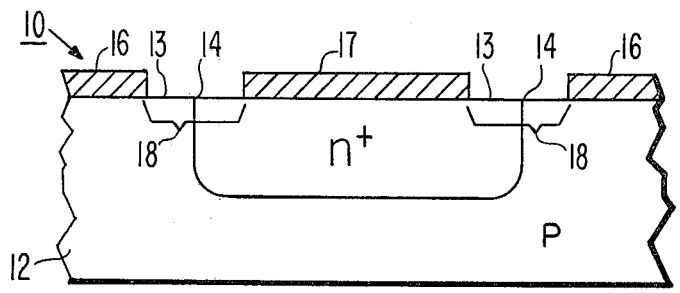
FIG. 1 is a sectional elevation of a portion of a silicon wafer after the initial step of the method of the present invention.

The present invention provides a means for accomplishing metallization and passivation of devices having active components in one single photolithographic resist step for a single-junction active device. The invention for a diode will be understood by reference to an embodiment illustrating the steps illustrated by FIGS. 1, 2 and 3 of the drawing. An embodiment of the invention for forming a mesa-type transistor (two-junction active device) will be described hereinafter as shown in FIGS. 5-8.

Referring first to FIG. 1, a semiconductor device 10 is suitably prepared with at least one active component, namely a pn+ rectifying junction in the crystalline region 12 of the device. Region 12 may be formed of polycrystalline silicon or preferably single crystal silicon. An active component refers to an active element within the device 10 which exhibits transistance, i.e., a capability of controlling voltages or currents so as to produce gain or switching action in a circuit, such as amplification or rectification. In other words, the semiconductor device 10 has an active component therein, such as a Schottky barrier diode, pn junction diode, transistor, or thyristor, whose performance would be degraded by the removal of needed charge carriers or by the generation of unwanted charge carriers, and thus, whose passivation thereof would have a beneficial effect on the operating performance of the device 10. In the present example, the crystalline region 12 comprises a portion of a silicon wafer.

Figure 2:
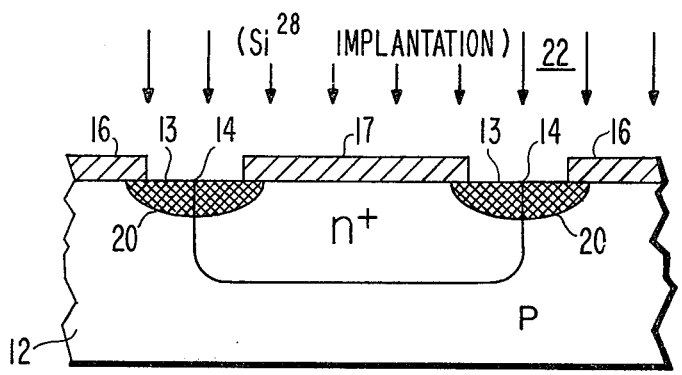
FIG. 2 is a schematic of the wafer after the second step embodying the invention.

In the practice of the present invention, a part of the crystalline region 12 adjacent the surface 13 is to be converted to an amorphous layer of graded crystallinity. This portion is designated region 18 in FIG. 1 which will be converted step by step into an amorphous region (20) as shown in FIG. 2 and a final amorphous hydrogenated region (24) in FIG. 3 as will be described in detail hereinafter.

The device 10 is initially coated with metal 16, such as aluminum, over the surface 13. The metal is then etched by a suitable metal etchant, such as aluminum etch formed of a mixture of phosphoric, nitric and acetic acids, after having a photolithographic resist pattern laid over the metal to define the active contact regions, under metallized portions 16 and 17, which are to remain metallized. When the photoresist process etching is completed, the metal etched away leaves exposed the passivating regions 18 containing the junctions 14 defined by the pn+ region. In the present example, an island of metal 17 is surrounded by the rectifying junction 14 while metal portion 16 surrounds the junction 14. It is to be noted that this is the only photo-etch step that is needed to form the completed device with a rectifying junction.

The next step provides for implanting the passivating regions 18 with energized particles such as an electron beam or preferably ionized particles such as $Si^{28}$ atoms. The particles, designated 22, bombard the surface 13 with sufficient energy to convert a part of the region adjacent the surface 13 into an amorphous region 20 of graded crystallinity. By "graded crystallinity" is meant that the upper portion of region 20 is amorphous silicon that gradually increases in crystallinity as the region 20 extends into region 12 as explained in the above-mentioned patent application of Pankove. In the present embodiment, this bombarding step is performed by subjecting the surface 13 to a beam of $Si^{28}$ ions to provide an implantation dose amounting to $5 \times 10^{15}$ atoms/cm through the surface 13. The ions are generated within a conventional ion implantation chamber system (not shown) and may have an energy in the range of 10–300 KeV. In the present example, an energy of 240 KeV was utilized. The bombardment of the ions resulting from such energy causes amorphization to extend about 0.2 micrometer below the surface 13 as indicated by the region 20 in FIG. 2. The thickness of the amorphous layer 20 may vary between 0.01 and about 0.2 micrometer depending on the energy and mass of the bombarding particles. The purpose of the bombarding particles is to convert the top part of the crystalline region adjacent surface 13 into the amorphous layer 20 of a gradually increasing crystallinity as explained above. Moreover, as stated above other types of particle bombardment may be utilized such as an electron beam.

It should be appreciated that the bombardment by the particles does not affect the contact regions under the metal layers 16 and 17. Accordingly, the contact regions of the crystalline region 12 are maintained in the crystalline state and are not amorphized. By "amorphized" is meant that a region is rendered amorphous from a single crystalline or polycrystalline state.

The next step involves heat treating the contact metal 16 and 17 to develop good contact between the metal and the semiconductor. This is a conventional procedure done usually at 400°–500° C. The effect of this heat treatment is to assure firm adhesion of the metal 16 and 17 to the crystalline region 12 of the device 10 and to reduce contact resistance between the metal and semiconductor. For a refractory metal-semiconductor Schottky rectifier (not shown), the heat treatment temperature required is about or above 600° C. in order to form metal-silicide for desirable device performance and stability. If the heat treatment temperature required is above 600° C., there is a tendency for the amorphized region to partially return to crystalline state thus reducing the desired effect of ion implantation. For such a condition this heat treatment step can be done before the amorphization step, i.e., before the step involving bombardment by ionized particles.

Figure 3:
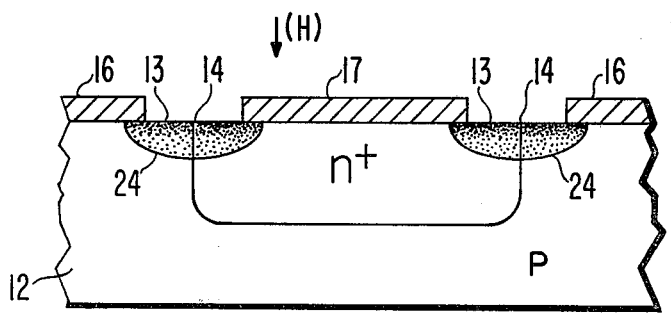
FIG. 3 is a schematic of the wafer in its final form according to the invention.

The next step in the procedure is the exposure of the surface 13 to atomic hydrogen between 5 to about 50 atomic percent of hydrogen to neutralize the dangling bonds existing in the semiconductor device 10. The dangling bonds are surely neutralized if not annihilated by the atomic hydrogen. The hydrogen atoms penetrate the amorphized layer 20 of FIG. 2 and tie the dangling bonds by bonding to a dangling orbital at each surface Si atom to form a hydride ($Si:H$, $Si:H_2$, or $Si:H_3$) inducing a wider energy gap than that of a crystalline semiconductor. As a result of this energy gap expansion, barriers are formed in the amorphized layer 20 to both electrons and holes to prevent their access to the surface 13. The resulting amorphized and hydrogenated region 24 as illustrated in FIG. 3 provides a strongly adherent passivating layer which repels electrons and holes from the non-metallized surface 13 of the device 10 and which also inhibits generation of electrons and holes.

The process described hereinabove provides a means for achieving a highly stable semiconductor device having a single rectifying junction such as a diode with but a single etching step. By first metallizing the surface of the semiconductor device 10, the regions not to be amorphized are masked by the metal to prevent the active contact regions under the metal from being amorphized. Amorphization of the active contact regions of the crystalline region 12, it should be noted, will increase the forward saturation voltage of the device and thus be detrimental to the normal operation of such devices. Advantageously, the metal portions 16 and 17 serving initially as a mask can subsequently serve as the metallization for the lead or clip connections to device terminals.

The high temperature contact heat treatment procedure step described above by being done prior to hydrogenation eliminates the problems of hydrogen evolution at temperatures higher than the hydrogenation temperature (typically $\leq 400°$ C.). The evolution of hydrogen from surface 13 can cause a degradation in the quality of passivation.

EXAMPLE

In a specific example in the practice of the invention an array of $n^+p$ diodes was formed in a body, such as crystalline silicon region 12 of FIG. 1, by a diffusion process. The high temperature silicon dioxide (known as "thermal" $SiO_2$), which was produced during the forming of the $n^+p$ junction, was removed, it should be understood, by etching in an HF solution. An 8000 angstrom aluminum film was evaporated by an E-gun onto the single crystalline silicon device body. The contact regions under the metal portions 16 and 17 and the passivating regions 18 were then defined photolithographically as illustrated in FIG. 1. The metal was sintered at 475° C. for 15 minutes in an environment of helium. The region 18 to be passivated was implanted with $Si^{28}$ atoms with 120 KeV energy and a dosage of $5 \times 10^{15}/cm^2$. These energetic atoms amorphized the crystalline silicon (region 12) to a depth of about 1000 angstroms as shown by region 20 of FIG. 2. The reverse leakage current ($I_R$) of the diodes were measured to be three orders of magnitude higher than those before the silicon ion implantation. This high reverse current is caused by amorphization and creation of dangling bonds. The leakage current for the diodes before the silicon ion implantation was measured with the junctions 14 passivated with clean thermal $SiO_2$ (silicon dioxide). Furthermore, there was no change in the forward I-V characteristics (of the structure of FIG. 2) indicating that the aluminum film (metal portions 16 and 17) is a sufficient mask for preventing amorphization in contact regions (under metal portions 16 and 17). Moreover, the slight doping of aluminum film caused by the bombardment of the silicon atoms does not measurably change the conductivity of the aluminum film.

The device in the tested experiments was then hydrogenated in a hydrogen glow discharge in a chamber at a substrate temperature of about 300° C. for ½ hour and a pressure at about 1 torr. The reverse leakage current of the diodes measured then dropped by three orders of magnitude. That is, the reverse leakage current returned to the original pre-amorphization values. It was evident that the dangling bonds of silicon had been annihilated and the high resistivity of the amorphized region 24 had been maintained. A metallized and passivated diode as shown in FIG. 3 made according to these tests was subjected to high temperature reverse bias stability tests. The diode defining the junction 14 had a stability that was at least comparable to that of a passivated and neutralized junction.

In general, the step of exposing the amorphized layer to atomic hydrogen is done in a chamber in which the molecular hydrogen ($H_2$) is converted to atomic hydrogen (H) in a hydrogen glow discharge at a pressure of about 5 torr or less from a few minutes to several hours. The substrate or wafer is at a temperature lower than about 450° C.

For power Schottky diodes useful for high current applications refractory metals (such as W, Mo) are usually used as the barrier metal. These metals require high heat treatment temperature (>600° C.). Conventional procedures will then cause hydrogen evolution and degradation of the passivated layer 13. According to this invention, no such degradation will occur, since the heat treatment will be done prior to the amorphization and hydrogenation steps as described above.

Figure 4:
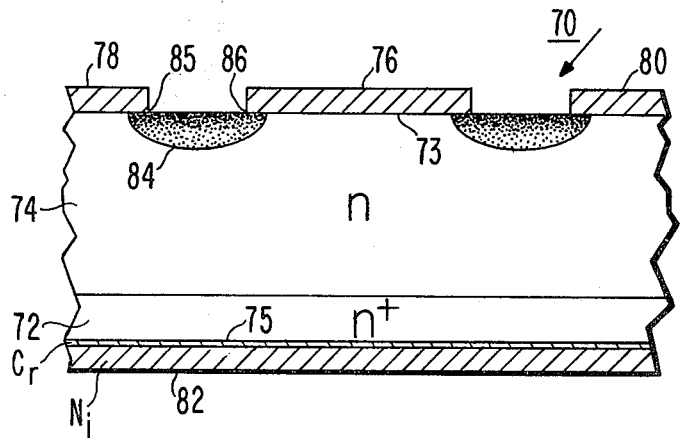
FIG. 4 is a schematic of a wafer illustrating a Schottky barrier diode made according to the present invention.
Figure 5:
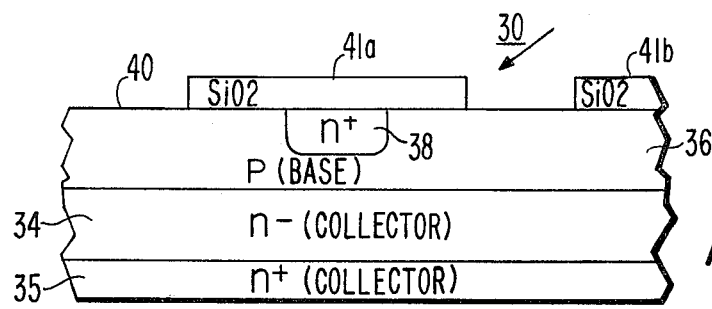
FIGS. 5-8 are schematics of sequential steps for forming a wafer into a mesa transistor according to the invention.

Reference is made to FIG. 4, which illustrates a Schottky barrier diode made in accordance with the process of the present invention. A Schottky diode 70 was formed using a conventional epitaxial growth process starting with a semiconductor wafer defined by region 72 formed as an n+ region upon which an n region 74 is formed. Metal was deposited on both the upper surface 73 and the lower surface 75. The metal on the upper surface to form a rectifying junction with n region 74 may be of one type such as tungsten and molybdenum while the bottom metal layer 82 to provide ohmic contact with region 72 may be formed of nickel alone or may be formed of a first layer of chromium upon which nickel is deposited. The metal in the upper surface 73 was etched into layers 76, 78 and 80 to define therebetween the passivating region 84 which was then treated with the amorphization and hydrogenation process steps explained above. The passivated region 84 of graded crystallinity protects particularly the junction of the metal with the n region 74 at interfaces 85 and 86.

The invention can be practiced for making active devices having two rectifying junctions as embodied, for example, in a mesa transistor having an epitaxial base. Furthermore, the invention may be practiced in the making of a depletion etch transistor with a diffused base. Other forms of transistors may be made according to the invention as will be apparent to those skilled in the art in view of the transistor embodiment to be described.

The development of a so-called mesa transistor in practicing the invention will now be described by reference to FIGS. 5-8. The mesa transistor device 30 is formed on an epitaxial wafer with a compound collector consisting of n⁻ region 34 and n+ region 35 (for reducing semiconductor resistance and to improve the ohmic contact between metal and the collector surface) and a p-type base region 36. An n+ region 38 is formed in the p region 36 to the depth required for forming eventually the emitter region of a mesa transistor. The region 38 is formed by any conventional method such as ion implantation or doped oxide deposition and diffusion processes. The surface 40 of the base 32 is provided with a thermally grown silicon dioxide and then removed by a conventional photoresist etching step to leave the $SiO_2$ layer 41a shown over the portions to be preserved prior to the etching step for developing the mesa moat. The photoresist step to define the $SiO_2$ layer 41a is the first of only two photoresist steps necessary to develop the mesa transistor according to the present invention.

Figure 6:
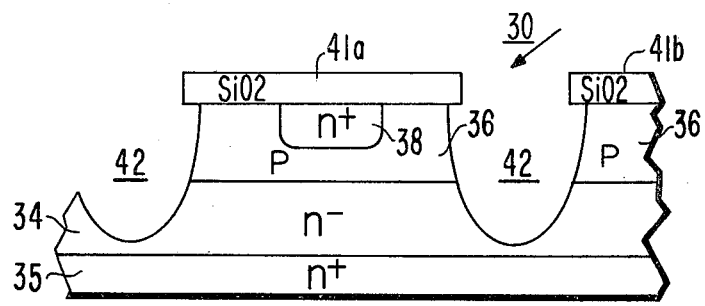

Referring now to FIG. 6, there is shown the device 30 after the etching step of removing the material from regions 36 and 34 to develop the moat 42 to surround the mesa. The moat 42 is developed in a conventional way using etchant such as a FAN etch (a mixture of hydrofluoric, acetic, and nitric acids) or alkali hydroxide (usually either KOH or NaOH aqueous solution) leaving the $SiO_2$ layers 41a and 41b, etc on the mesas. The $SiO_2$ layer (as well as the photoresist over it when FAN etch is used) serves to protect the underlying Si from being erroded by the etchant.

The next step of the process consists of removing completely the layer 41a and 41b of silicon dioxide from the surfaces of the p region material 36 and n region material 38. The etchant for the silicon dioxide is a conventional buffered HF. It is noted that no photolithographic process step is involved in this etching step.

Figure 7:
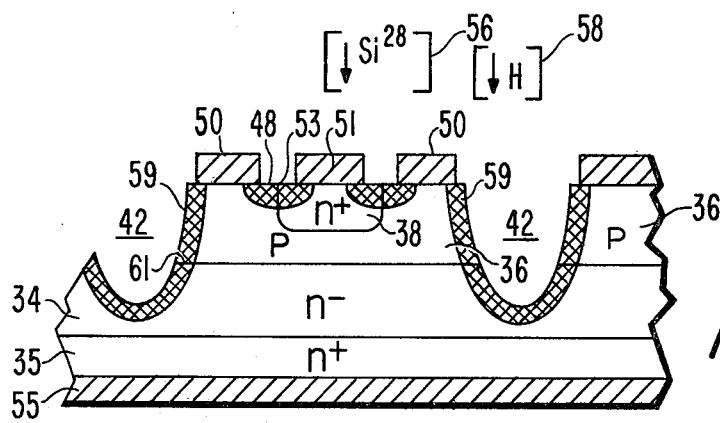
Figure 8:
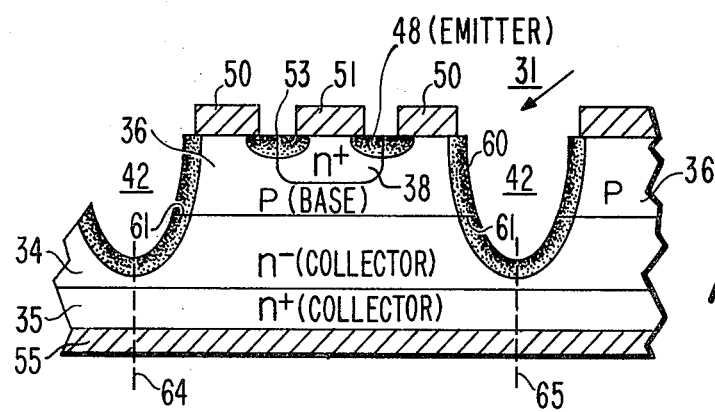

Then, the metal such as aluminum is applied to all the exposed surfaces of the regions 35 and 36. A photoresist pattern is applied to the metal on regions 36 and 38 to define the metal that is to be removed for developing the regions 48 and 59 that are to be passivated as shown in FIG. 7. The metal is then etched away leaving the islands of metal 50, and 51. The region 48 it is noted bridges the rectifying junction 53 defined by the n+ region 38 and the p region 36. It should be understood that the junction 53 as seen in FIG. 7 is in fact part of a continuous junction around the island 51 and in a circuit sense represents a single rectifying junction. It should be noted that the entire metal layer 55 is protected also from being etched using a protective coating such as glycothiolate wax. Note that no photolithographic resist is involved in this step.

The wafer containing device 30 is then treated with heat to provide good adhesion and an ohmic contact of the metal to the semiconductor material. If the metal is, for example, tungsten, the temperature required will be in the order of 600° C. or greater. However, if the metal is aluminum, then the temperature required for heat treatment will be in the order of 400°-500° C. For such relatively lower temperatures it may be advantageous to heat treat the metal after the amorphization step to follow. This is because the heat treatment may improve the conductivity of the particle bombarded metal film. The heat treatment as conventional in the art essentially allows the metal (50, 51, and 55) with the crystalline silicon material in regions 35, 36 and 38.

The next step is to amorphize the region 48 containing the junction 53 as well as the region 59 on the surface of the mesa moat containing the PN junction 61. These junctions 61 as indicated in FIG. 7 also is essentially a single junction that surround the mesa structure to serve as the junction between base and collector region of the mesa transistor.

The regions 59 and 48 are now amorphized with particles of high energy such as ions of silicon $Si^{28}$ in a manner described in the aforementioned Pankove application. More particularly, in the practice of the present invention, the particles are implanted as represented by the arrow within bracket 56 with the particles to impinge upon the surface defining the region 48 and also in the region 59 within the moat area 42. In order to assure total particle implantation of the region 59 in the moat, the wafer comprising the device 30 is maneuvered in such a way as to expose the surfaces to the particles 56. It should be understood that suitable modifications are required of the existing conventional implantation mechanisms to maneuver the wafer to various positions as by a suitable mechanism to provide planetary motion such that the direction of the particle beam will be nearly normal to all surface portions of regions 48 and 59. Any suitable structure to achieve this planetary motion may be used in the practice of the invention to achieve the required total implantation of the high energy particles on the desired surfaces to achieve the desired amorphization of such surface regions.

The next step in the process is to hydrogenate the surface regions 48 and 59 to neutralize the dangling bonds existing in the device regions just amorphized. As described in the first embodiment (FIGS. 1–3), the atomic hydrogen used to provide this hydrogenation step usually is in the order of between about 5 to 50 atomic percent of hydrogen. After the hydrogenation process which can take anywhere from a few minutes to several hours depending on the depth of the amorphized regions which are to be hydrogenated, the dangling bonds are surely neutralized, if not annihilated by the atomic hydrogen. As described hereinabove, the hydrogen atoms represented by bracket 58 penetrate the amorphized layers 48 and 59 to develop a stable region of graded crystallinity that is strongly adherent to the device regions 36, 38 and 34. Furthermore, the regions 48 and 59 repel the electrons and holes and inhibit generation of electrons and holes thereby providing a very stable device. Each transistor pellet is then formed by dicing along lines 64 and 65 and the mesa transistor as so formed is illustrated as device 31 in FIG. 8 (wherein the regions 59 and 48 are represented by the dotted region) is the desired mesa transistor having the junction regions 53 and 61 passivated with a hydrogenated amorphized region. The mesa transistor 31 it should be noted has been formed using only two photolithographic resist and etching steps.

The mesa transistor 31 developed according to the process described above as shown in FIG. 8 is achieved with only two photoresist steps whereas in conventional methods heretofore practiced, the mesa transistor requires four separate photolithographic resist and etch steps. In the prior art in the fabrication of the mesa transistor one first employs the thermal silicon dioxide formed during previous diffusion steps to define the areas of the mesa moats using a photolithographic etching step as described herein before for the present invention.

Then a photoresist etch step is used in the prior art (but not for the present invention) to remove the silicon dioxide overhangs from the mesa edges similar to that shown in FIG. 6 above by regions 41a and 41b while leaving the emitter base junction surface covered with thermal $SiO_2$. It should be noted that in the conventional method, it is highly desirable to leave the thermal $SiO_2$ over the emitter-base junction surface since the density of dangling bonds (or interface states) at the Si/thermal $SiO_2$ interface is much lower than that of Si and other kinds of conventional passivants such as chemical vapor deposited silicon dioxide or silicon nitride. Furthermore, it is more critical to have low density of interface states at the emitter-base junction surface than that at the base-collector junction; a high density of interface states at the emitter-base junction surface can seriously degrade the low current gain of a transistor. It should also be noted as has been explained hereinabove with respect to the specific example that the amorphized-hydrogenated junction surface has as low a dangling bond density as that of a thermal $SiO_2$ passivated junction. Thereafter, in the prior art only a suitable passivant is chemical vapor deposited on the wafers such as silicon nitride and boron doped silicon dioxide. The third photoresist etch step is then used to remove the passivant to expose the emitter and base contact regions. Conventionally, two separate etching steps are required, one to etch the passivant comprising boron doped silicon dioxide in an HF solution with photoresist as the mask and after stripping the photoresist, a second etching step to remove the silicon nitride using typically hot phosphoric acid with the boron doped $SiO_2$ as the mask.

It is at this third photolithographic step in the conventional process that great difficulty is encountered. At this stage of the process in the prior art, the photoresist coverage at the mesa edges is usually quite poor. Specifically the sharp corners of the mesa often cause pinholes or thin spots in the photoresist. This poor photoresist coverage results in the passivants (boron doped $SiO_2$) being eroded by the etchant (HF solution) extending the pinholes in the oxide. Subsequently, the nitride under the pinholes are eroded in the second etchant (hot phosphoric acid) further extending the pinholes through the entire depth of the passivants. Accordingly, either outright failure or long term instability is manifested in such prior art structures reducing the device yield significantly.

Then after these prior art etching steps, metal is deposited on the structure to assume the form similar to that shown in FIG. 7 above. Thereafter, a photoresist etch process (the fourth prior art photoresist etch step) is used to remove the metal from the regions that are to be passivated similar to regions 48 and 59 of FIG. 7. The pinholes hereinbefore described may cause a further stability problem during the fourth prior art photo resist etching step by trapping metal ions from this metal etchant step which are difficult to remove in subsequent cleaning processes. Furthermore, the passivants near the pinholes may be further eroded by the metal etchants. The present invention not requiring a photoresist etch step to remove passivants cannot cause pinholes to develop.

Thereafter, in the prior art the metal is heat treated in a conventional way. It will be noted further that, according to the present invention, the process steps are such that high temperature treatments are done earlier in the process and the lower temperature process step for passivation by amorphization and hydrogenation is done without the device being subjected to high temperature treatments for metals as done in the conventional processes of forming mesa transistors.

The invention can be practiced also in forming other kinds of transistor geometry. One type of transistor is one in which the base-collector junction is formed in an etched moat such as by the so-called depletion etch method. See, for example, a description of the depletion etch method in the IEEE Transaction on Electron Devices, Vol. ED-23, p. 950, "The Theory and Application of a Simple Etch Contour for Near Ideal Breakdown Voltage in Plane and Planar p-n Junctions." Another type of transistor useful in practicing the invention is the so-called uni-moat mesa transistor in which a complete moat surrounds the mesa portion of the transistor.

What is claimed is:

1. A method for providing a semiconductor device having a rectifying junction disposed in a crystalline region of the device portion with a passivated surface over the junction comprising the steps of:
   (a) depositing metal over the surface of the device;
   (b) removing the metal defined by a photolithographically deposited resist from the surface portions of the device to expose the rectifying junction;
   (c) converting the region adjacent said surface of the rectifying junction into an amorphous layer of graded crystallinity; and
   (d) exposing the amorphous layer to atomic hydrogen whereby an integral layer of hydrogenated amorphous semiconductor material is formed adjacent the crystalline region.

2. The method according to claim 1, wherein said converting step comprises implanting the surface with particles of $Si^{28}$ with an energy of 120 kiloelectron volts and a dosage of $5 \times 10^{15}$ cm$^{-2}$.

3. The method according to claim 1, comprising the step of heat treating the deposited metal at a temperature of about 400°–500° C. before exposing the device to atomic hydrogen.

4. The method according to claim 1, wherein said exposing step comprises subjecting molecular hydrogen gas ($H_2$) to a glow discharge for conversion to atomic hydrogen within a chamber at a pressure below 5 torr and a temperature lower than about 450° C.

5. The method as recited in claim 1, wherein said semiconductor device comprises a silicon wafer and wherein the exposing step comprises subjecting the silicon wafer to sufficient atomic hydrogen so that the integral layer of hydrogenated amorphous silicon contains between about 5 and about 50 atomic percent of hydrogen.

6. The method according to claim 1, wherein the metal deposited is a refractory metal further comprising the step of heat treating the refractory metal at a temperature of about 600° C. or above before the step of converting the rectifying junction region into an amorphous layer.

7. A method for making a transistor from a crystalline semiconductor wafer having first and second major surfaces, a collector region adjacent to the first surface, a base region adjacent to the collector region and extending to the second surface, an emitter region adjacent the second surface and defining a rectifying junction with the base region, and a thermal silicon dioxide layer over said second surface, comprising the steps of:
   (a) removing the thermal silicon dioxide defined by a first photolithographically deposited resist from a portion of the second surface to expose a moat region;
   (b) etching a moat into the exposed surface from the moat region to expose the base-collector rectifying junction;
   (c) removing the entire silicon dioxide layer;
   (d) metallizing the remaining second surface to provide a metallized layer;
   (e) removing the metal defined by a second and final photolithographically deposited resist from the second surface of the device to expose the base emitter rectifying junction region;
   (f) converting the region adjacent both said rectifying junctions into an amorphous layer of graded crystallinity; and
   (g) exposing both said amorphous layers to atomic hydrogen whereby an integral layer of hydrogenated amorphous semiconductor material is formed adjacent the crystalline region.

8. The method according to claim 7, wherein said converting step comprises implanting the surface with particles of $Si^{28}$ with an energy of 120 kiloelectron volts and a dosage of $5 \times 10$ cm$^{-2}$.

9. The method according to claim 8, including the step of maneuvering the device to expose substantially all of the surface of the moat including the exposed junction directly to the particles of $Si^{28}$.

10. The method according to claim 9, comprising the step of heat treating the deposited metal and silicon at a temperature of about 400°–500° C. before exposing the device to atomic hydrogen.

11. The method according to claim 9, wherein said exposing step comprises subjecting molecular hydrogen gas ($H_2$) to a glow discharge for conversion to atomic hydrogen within a chamber at a pressure of $H_2$ below 5 torr and a temperature lower that about 450° C.

12. The method as recited in claim 1, wherein said semiconductor device comprises a silicon wafer and wherein the exposing step comprises subjecting the silicon wafer to sufficient atomic hydrogen so that the integral layer of hydrogenated amorphous silicon contains between about 5 and about 50 atomic percent of hydrogen.

* * * * *